United States Patent [19]
Vettiger et al.

[11] Patent Number: 5,327,415
[45] Date of Patent: Jul. 5, 1994

[54] INTEGRATED LIGHT DEFLECTOR AND METHOD OF FABRICATION THEREFOR

[75] Inventors: Peter Vettiger; Otto Voegeli, both of Morgan Hill, Calif.

[73] Assignee: International Business Machines Corporation, Armonk, N.Y.

[21] Appl. No.: 173,720

[22] Filed: Dec. 23, 1993

Related U.S. Application Data

[63] Continuation of Ser. No. 820,471, Jan. 14, 1992, abandoned.

[51] Int. Cl.$^5$ .............................................. G02B 6/32
[52] U.S. Cl. .................... 369/121; 369/122; 369/44.12
[58] Field of Search ............ 369/121, 122, 44.12, 369/44.14, 44.23, 44.13; 372/43-50

[56] References Cited

U.S. PATENT DOCUMENTS

| | | | |
|---|---|---|---|
| 4,716,559 | 12/1987 | Hine | 369/121 |
| 4,861,128 | 8/1989 | Ishikawa et al. | 369/122 |
| 4,893,296 | 1/1990 | Matsumoto et al. | 369/122 |
| 4,901,329 | 2/1990 | Leas | 372/50 |
| 4,950,622 | 8/1990 | Kwon et al. | 437/129 |
| 5,001,719 | 3/1991 | Trussell | 372/50 |
| 5,218,584 | 6/1993 | Gfeller | 369/44.12 |

FOREIGN PATENT DOCUMENTS

| | | |
|---|---|---|
| 0283044 | 3/1988 | European Pat. Off. . |
| 0363547 | 9/1988 | European Pat. Off. . |
| 0373329A3 | 10/1989 | European Pat. Off. ........ G03F 7/20 |
| 0373329A2 | 10/1989 | European Pat. Off. ........ G03F 7/20 |
| 6411390 | 1/1989 | Japan . |
| 641976 | 3/1989 | Japan . |
| 0129900 | 8/1989 | Japan . |
| 01281787 | 11/1989 | Japan . |

OTHER PUBLICATIONS

Patent Abstracts of Japan, vol. 016, No. 074 (E-1170) & JP-A-32 65 117 (Mitsubishi Electric Corp), 26 Nov. 1991.
Elektronik, vol. 37, No. 8, Jul. 1987, Munchen DE, pp. 69-77, E.-K. Aschmoneit 'Mikromechanik in der Elektronik'.
J. Mohr et al, "Requirements on Resist Layers in Deep-Etch Synchrotron Radiation Lithography", J. Vac. Sci. Technol B 6(6), Nov.-Dec. 1988, pp. 2264-2267.
G. T. Forrest, "Large-scale Laser Integration Arrives", Laser Focus World, Nov. 1989, p. 21.
P. Buchmann et al, "Smooth Angled Mirror Facet Fabrication", IBM Technical Disclosure Bulletin, vol. 32, No. 8A, Jan. 1990, pp. 155-156.
P. Buchmann et al, "Vertically Emitting Diode Laser with Integrated Front-Beam Monitor Photodiode", IBM Technical Disclosure Bulletin, vol. 32, No. 8A, Jan. 1990, pp. 149-150.
P. Mooney, "Photodiode Array for Monitoring Individual Lasers in a Laser Array", IBM Technical Disclosure Bulletin, vol. 27, No. 7B, Dec. 1984, pp. 4344-4345.
D. J. Webb et al, "Mirror Fabrication for Full-Wafer Laser Technology", Laser Diode Technology and Applications III, 23-25 Jan. 1991, SPIE Proceedings Series vol. 1418, pp. 231-239.
P. Vettiger et al, "Full Wafer Technology-A New Approach to Large-Scale Wafer Fabrication and Integration", IEEE Journal of Quantum Electronics, vol. 27, No. 6, Jun. 1991, pp. 1319-1331.

*Primary Examiner*—Constantine Hannaher
*Assistant Examiner*—Don Wong
*Attorney, Agent, or Firm*—Baker, Maxham, Jester & Meador

[57] ABSTRACT

An integrated light deflector and fabrication method are disclosed. In accordance with the method, a mold is constructed above the surface of a substrate using a thick photo resist and a mask to define a deflector plane. A collimated light beam is applied at an appropriate angle of incidence to the photo resist material and mask. The developed resist provides a mold into which the deflector body is cast, leaving a deflector body whose front surface serves as the deflecting surface.

6 Claims, 5 Drawing Sheets

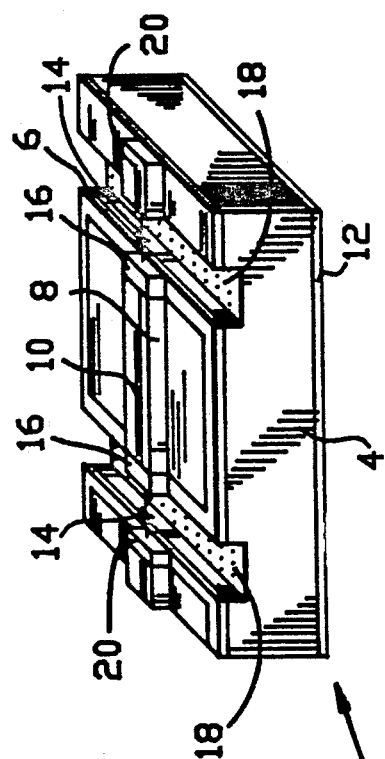
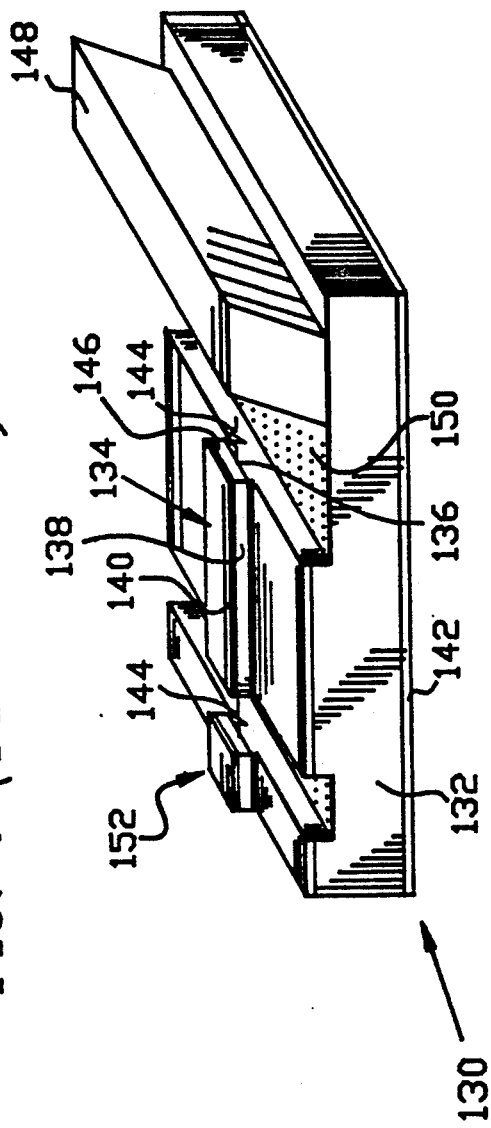
FIG. 1 (PRIOR ART)
FIG. 5

INTEGRATED LIGHT DEFLECTOR AND METHOD OF FABRICATION THEREFOR

This is a file wrapper continuation of application Ser. No. 07/820,417 filed Jan. 14, 1992, now abandoned.

BACKGROUND OF THE INVENTION

The field of present invention is semiconductor lasers, and more particuarly, large scale laser integration devices and fabrication methods therefor, including methods for fabricating optical deflection elements directly on a wafer substrate. Still more particularly, the invention relates to the fabrication of an optical input/output port in a semi-conductor laser device.

Recent attention has been directed to full-wafer technology for large scale laser fabrication and integration that have many of the characteristics of large scale integrated circuits. See, P. Vettiger et al., *Full-Wafer Technology—A New Approach to Large-Scale Laser Fabrication and Integration*, IEEE Journal of Quantum Electronics, Vol. 27, No. 6 (June 1991). Wafer scale laser fabrication represents a dramatic departure from the usual semiconductor laser production approach wherein significant laser processing is performed following the scribing and cleaving of the wafer substrate to form a plurality of laser mirrors. In this prior approach, important processing steps, such as mirror coating and laser testing, must be performed at the bar/chip level. It will be appreciated that the individual handling and processing of components at this level is a significant production obstacle. Large scale laser integration promises to yield considerably improved efficiencies. Among the recognized advantages of full-wafer laser fabrication are reduced handling of laser chips, automated full-wafer processing, burn-in and testing, potentially higher yields, a wide variety of new device configurations and the ability to provide on-wafer integration of auxiliary electrical and optical components.

An important requirement of large scale laser integration is the ability to fabricate mirror surfaces without cleaving the substrate. Thus, in proposed large scale laser devices, the cleaved mirror facet is replaced by an etched groove whose faces form the mirror facets. A conventional etched construction is shown generally in FIG. 1, which illustrates a semiconductor laser 2 whose construction, by way of example, may be that of an AlGaAs single-quantum well ridge laser. The laser 2 may be constructed from a wafer substrate 4 formed from a plurality of semiconductor p and n layers grown epitaxially. Positioned between the p and n layers is an active quantum well layer 6 disposed within a ridge waveguide structure 8. Positive and negative conductive elements 10 and 12 are respectively positioned on the upper and lower surfaces of the substrate 4 to provide forward biasing. The quantum well layer 6 confines the minority carriers in a direction perpendicular to the junction formed with the p and n layers, and modifies the density of states such that very efficient lasing action is realized. Optical confinement parallel to the junction plane is provided by the ridge wave guide. When the laser 2 is energized, the laser beam 14 emerges from the laser mirror facets 16 formed by the etched grooves 18. Either of the opposing facets 20 of the grooves 18 may be formed as part of an integrated monitor diode.

In conventional wafer scale fabrication, the wafer substrate 2 is formed with a plurality of parallel ridge waveguide structures. A series of individual lasers are then provided by forming a plurality of etched grooves extending perpendicularly to the ridge wave guide structures. FIG. 1 illustrates one such ridge wave guide structure bounded by two perpendicularly oriented etched grooves. Typically, an integrated monitor diode will be formed at the opposing side of one of the bounding groove structures. The other groove will be cleaved down the middle to provide the laser output.

The etched grooves may be formed using a variety of highly anisotropic etching techniques. For example, wet-chemical etching, reactive ion etching (RIE), ion-beam etching, focused ion-beam etching (FIBE), reactive ion-beam etching (RIBE) and chemically assisted ion-beam etching (CAIBE) have all been proposed for producing laser mirror trenches of varying quality. Advantageously, regardless of which etching approach is favored, the use of microlithographic techniques generally enables the formation of laser mirror facets of practically any size, shape and orientation. Thus, a variety of wafer integrated laser structures may be formed, including short cavity lasers, groove coupled-cavity lasers, lenses, staggered arrays, monitor photodiodes and beam shaping devices.

Of particular interest with respect to the present invention, are integrated laser mirror structures incorporating both a laser mirror and a beam deflector. In structures of this type, the etched groove includes one vertically oriented face and one angled face. The vertically oriented groove face serves as a laser mirror and emits the beam parallel to the substrate, while the angled groove face functions as a deflector to deflect the beam generally normal to the wafer. Etched mirror/deflector structures of this type have been fabricated using known beam etching methods. In accordance with conventional practice, the position of the mirror and deflector faces are defined by a photo resist mask and their orientation is defined by the ion beam's angle of incidence. Hence, whereas the laser-mirror is fabricated with a perpendicular ion beam, the deflector is fabricated (using a different mask) with the ion beam incident at a 45 degree angle. FIGS. 2a, 2b and 2c illustrate a sequence of processing steps utilizing this method. The sequence represents an approach wherein the deflector is fabricated prior to the laser mirror.

FIG. 2a shows a cross-section through a trench or well 22 whose back wall 24 will serve as the beam deflector. It has been fabricated utilizing the masking edge 26 of a mask having a first portion 28, and a 45 degree milling direction shown by the arrow m. An opposing wall 30 is formed simultaneously using the masking edge 32 of a second mask portion 34. FIG. 2b shows the next masking step wherein the masking-edge 36 of a mask 38 is used to define the laser mirror surface 40 shown in FIG. 2c. A protective mask 42 protects the deflector surface 24 from further etching. The ion etching beam is then applied at normal incidence to generate, after resist-removal, a mirrored-deflector geometry as shown in FIG. 2c.

The two principal problems with the fabrication method illustrated in FIGS. 2a–2c are illustrated in FIG. 3a. FIG. 3a shows a vertical cross-section through the mirror geometry of FIG. 2c. An active layer 42 in the wafer substrate generates a laser pulse 44 which is emitted as a diverging laser beam emitting from the laser mirror 40. The first flaw is that the deflector does not intercept the whole cross-section of the beam. This is because, being the back-side of the fabricated structure, its spacing from laser facet 40 is large. Thus, the trench 22 needs to be deep while an upper portion 48 of the beam 46 just passes above the wafer surface. As a result, the deflected beam 50 is only partial and asymmetrical. A second problem exists with regard to the optical quality of the deflecting mirror 24. With any substractive process, there occurs an erosion of the masking edge and the deflector surface quality deteriorates with increasing edge-depth. Since the deflector surface 24 is substantially larger than the mirror surface 40, its optical quality is correspondingly worse.

Accordingly, there is an identified need for a fabrication method for producing an optical mirror/deflector configuration that overcomes the above disadvantages.

SUMMARY OF THE INVENTION

The present invention is directed to an integrated light deflector and fabrication method for producing deflector configurations possessing features and advantages of an ideal deflector geometry. To that end, a novel additive fabrication method, as opposed to a conventional substractive etching method, is employed. In a preferred embodiment, a mold is constructed above the surface of a substrate using a thick photo resist layer and a mask to define a deflector plane. A collimated light beam is applied at an appropriate angle of incidence to the photo resist material and mask. The developed resist provides a mold into which the deflector body is cast. The mold may be left in place or, alternatively, may be dissolved, leaving a free-standing deflector body whose front surface serves as the deflecting surface.

BRIEF DESCRIPTION OF THE DRAWINGS

FIG. 1 is a diagrammatic illustration of a prior art laser device formed using full-wafer fabrication techniques.

FIG. 2b is a partial cross-sectional view showing a second step of the prior art fabrication process shown in FIG. 2a.

FIG. 2c is a partial cross-sectional illustration of a third step of the prior art fabrication method shown in FIG. 2a.

FIG. 4b is a partial cross-sectional side view of a second step of the fabrication process of FIG. 4a.

FIG. 5 is a diagrammatic illustration of a large scale laser integrated device constructed in accordance with the present invention.

DETAILED DESCRIPTION OF PREFERRED EMBODIMENTS

Figure 2A:
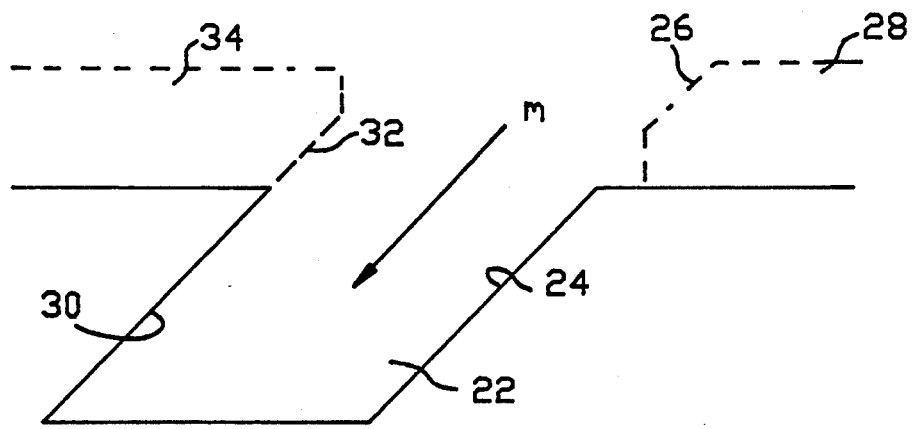
FIG. 2a is a partial cross-sectional view of a first etching step in a prior art method for the fabrication of a laser mirror/deflector structure.
Figure 2B:
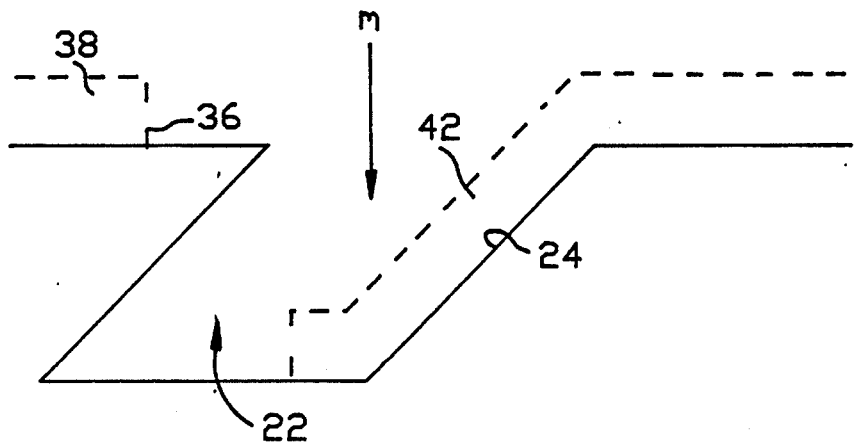
Figure 2C:
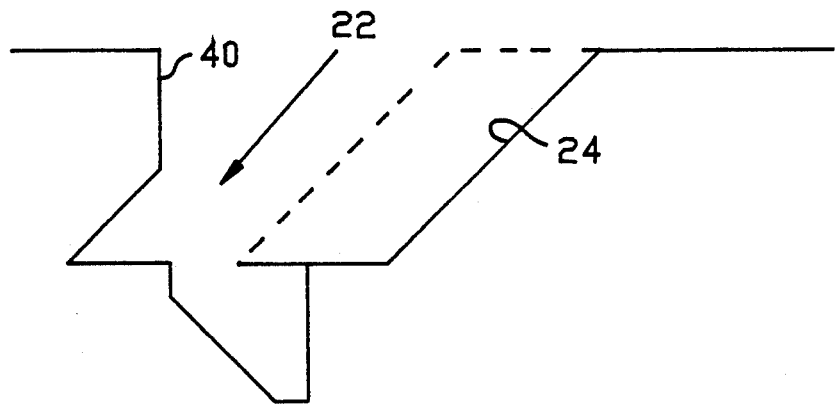
Figure 3A:
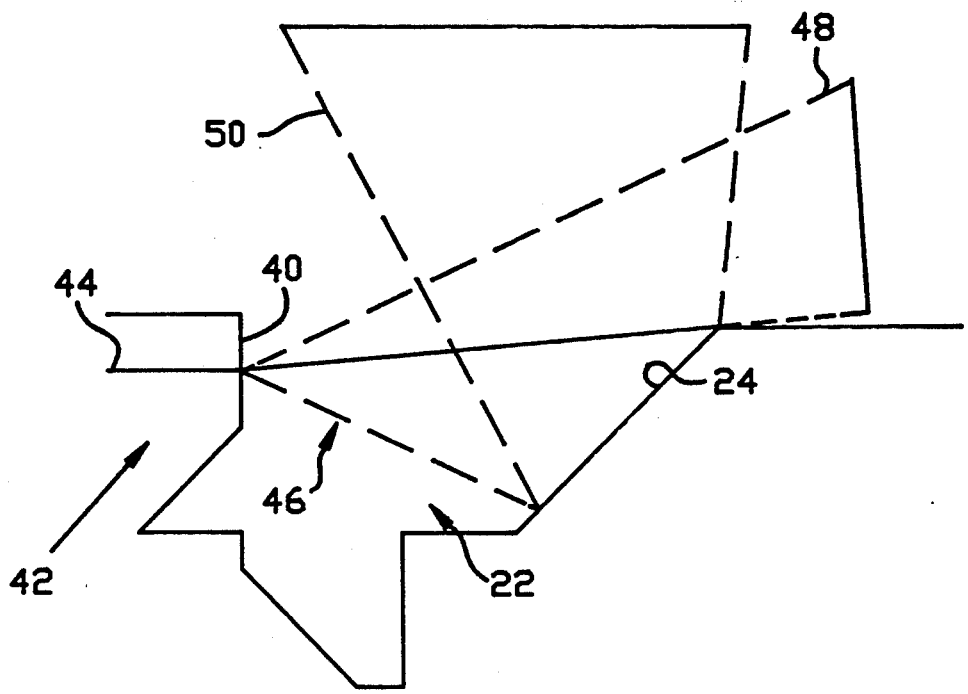
FIG. 3a is a partial cross-sectional view of the completed prior art laser mirror/deflector structure of FIG. 2c showing an operational disadvantage thereof.
Figure 3B:
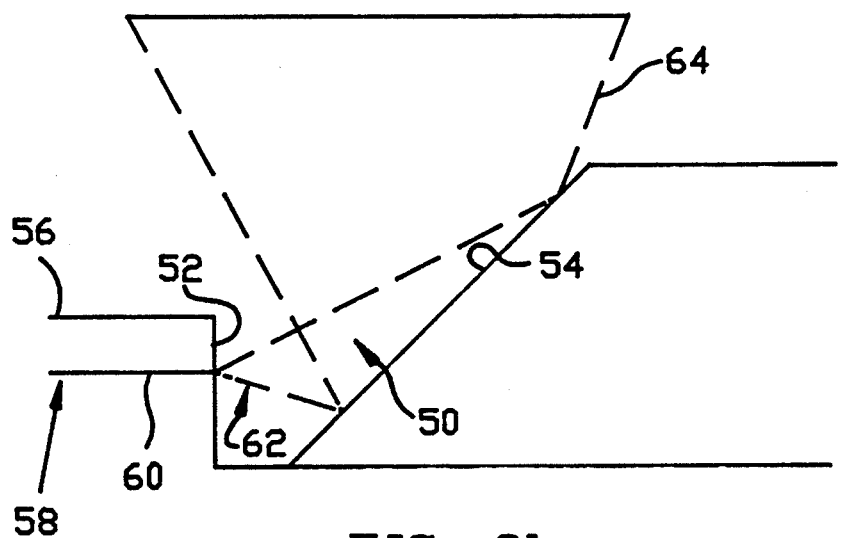
FIG. 3b is a partial cross-sectional view of an ideal laser mirror/deflector as proposed by the inventors herein.

It is submitted that an ideal deflector geometry would be similar to that depicted in FIG. 3b. In that configuration, a groove 50 includes a laser mirror face 52 and a deflector face 54. The deflector mirror 54 is close to the laser mirror 52 and rises above the wafer surface 56. The wafer includes an active region 58 that generates a laser pulse 60. The laser mirror ouputs a diverging beam 62. As shown, the ideal geometry would intercept all of the laser beam 62 and reflect a symmetrical beam 64 generally normal to the substrate surface.

Figure 4A:
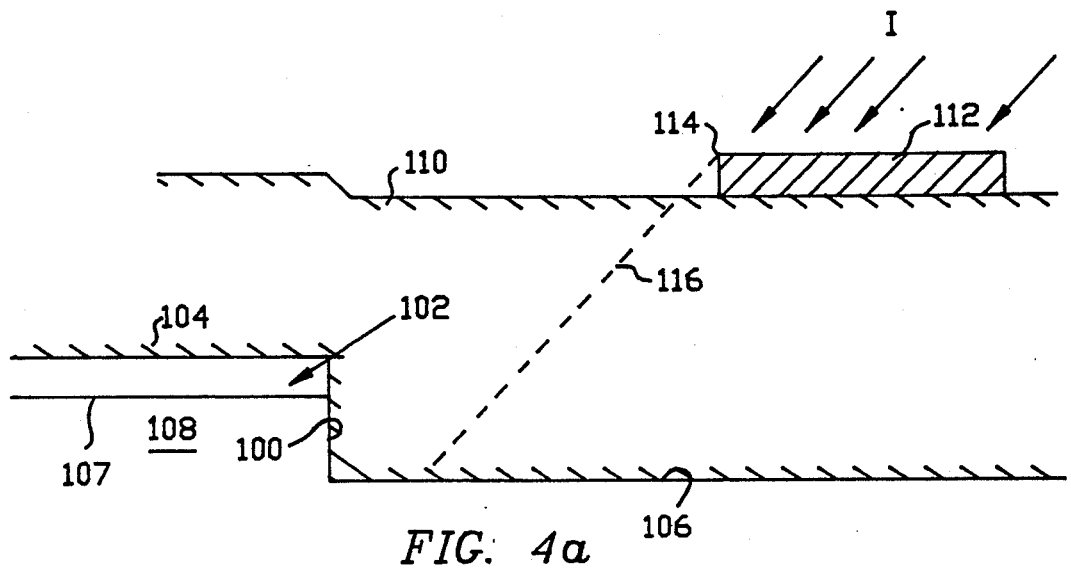
FIG. 4a is a partial cross-sectional side view of a first step in a method for fabricating a laser mirror/deflector structure in accordance with the present invention.
Figure 4B:
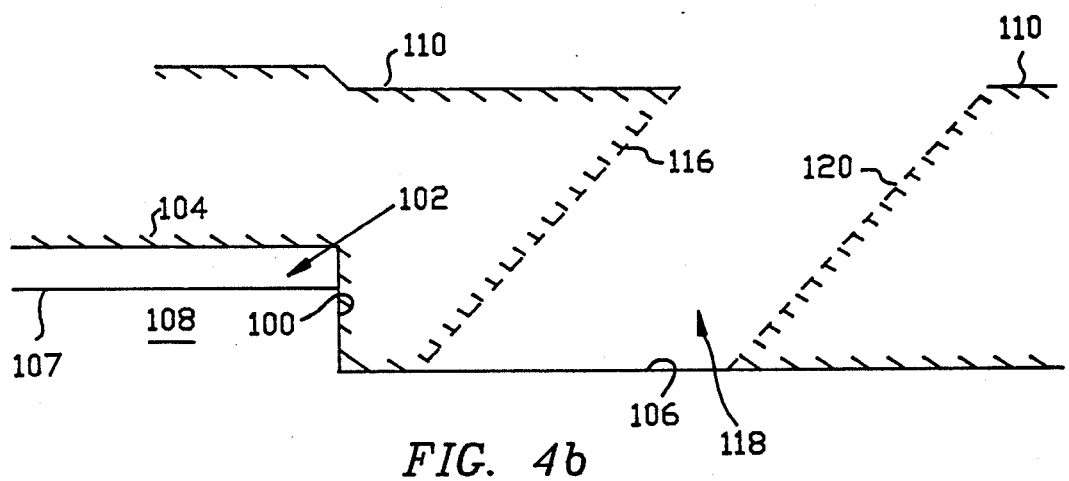
Figure 4C:
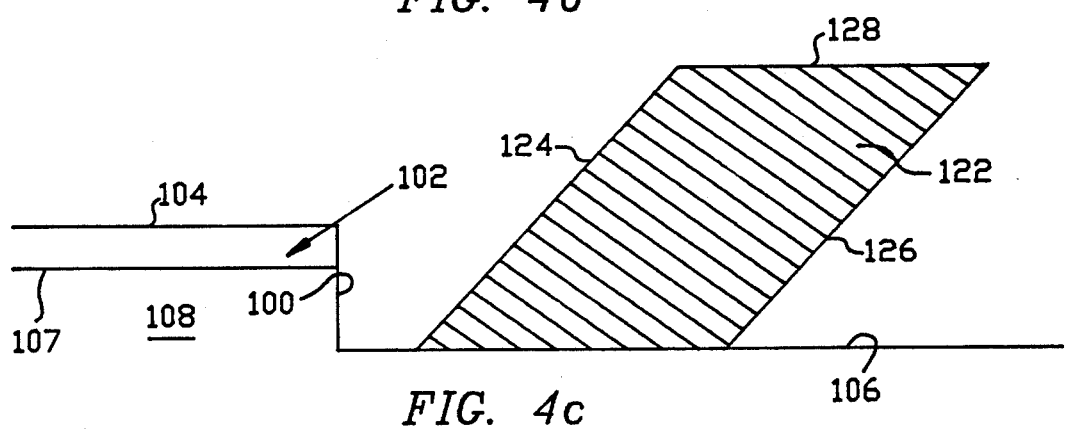
FIG. 4c is a partial cross-sectionalal side view of a third step of the fabrication method shown in FIG. 1.

FIGS. 4a, 4b and 4c illustrate an exemplary fabrication method in accordance with the present invention which differs conceptually from the prior art in that a deflector body is not carved out of a wafer material but is instead added to it. The example of FIGS. 4a-4c show a sequence of processing steps used to fabricate, for example, a 45 degree deflector. In FIG. 4a, a laser mirror 100 is formed by a conventional ion-beam etching wafer method in a substrate 102. For GaAlAs lasers, chemically assisted ion-beam etching (CAIBE) is preferred. The wafer substrate 102 may be formed as a single-quantum well ridge device of the type described above in the section entitled Background Of The Invention. Many other laser structures could also be used, it being understood that the invention is not limited to any particular semiconductor laser type or structure. The laser mirror 100 extends vertically between an upper substrate surface 104, representing a top portion of a ridge wave guide structure, and a lower substrate surface 106, representing a mirror trench into which the deflector will be fabricated. It will be understood that the substrate 102 includes multiple semiconductor layers, including an active layer 107, and appropriate beam confining structure. When provided with appropriately positioned positive and negative conductive elements, a laser device 108 may be formed which, when activated with an above threshold drive current will emit a highly divergent output beam through the laser mirror 100 as shown in the ideal laser mirror/deflector well configuration of FIG. 3b.

Following the formation of the laser mirror 100, the wafer substrate 102 is coated with a layer of photo resist material 110, as shown in FIG. 4a. Various materials may be used to form the photo resist layer, including any of methylmethacrylates, such as polymethylmethacrylate (PMMA). These materials have in common the property that when exposed to an appropriate light source, they harden and become resistant to subsequent photo chemical development which would otherwise dissolve the photo resist material. Advantageously, the photo resist material can be spun under suitable conditions in one or several layers to a desired thickness, several microns for example, with an essentially planarized top-surface. The thickness of the applied photo resist may be varied but should not be less than the desired height of the deflector to be created. As shown in the ideal configuration of FIG. 3b, the deflector height may be in excess of the height of the uppermost surface of the substrate.

Following the deposition of the photo resist material 110, a mask 112 may be placed or fabricated on top of the photo resist coating. The mask 112 includes a masking-edge 114 that is used to define a boundary line at the position of the reflecting surface of the deflector to be created. This boundary surface is shown by the reference number 116 in FIG. 4a. The mask 112 may be made from any number of suitable radiation resistant materials. When X-ray radiation is used, the mask 112 is preferably a gold film fabricated directly on the photo resist layer 110. When other wavelengths are used, the mask may be made of any suitable opaque material.

After placement of the mask 112 at a position whereby the masking edge 114 defines an appropriate position for the reflecting surface of the deflector to be created, the wafer is exposed to a collimated light beam I at a selected angle of incidence, for example, 45 degrees. It is the boundary surface 116, between the exposed and unexposed resist that will become the reflecting surface of the deflector structure to be created. The quality of this surface is governed by the straightness of the masking edge 114, the perfection of beam collimation and the absence of reflections across the boundary surface 116. The latter consideration requires that all reflections pass into the exposed region of the resist. In the example of FIG. 4a, that result is achievable using negative resist and masking the right side of the boundary 116. Satisfactory collimation has been obtained by X-ray exposure, which is also the light source of choice considering the thickness of the resist. After the photo resist coating 110 has been exposed, the mask 112 is removed and the photo resist is developed. This causes the photo resist material that was unexposed as a result of the mask 112 to be consumed, leaving a cavity or mold 118 as shown in FIG. 4b. The mold 118 is defined by the lower surface 106 of the substrate 102, the boundary surface 116 and a rear surface 120. The surfaces 116 and 120 extend from the lower substrate surface 106 at the angle of incidence of the beam I', or 45 degrees in the example shown.

With the mold 118 now formed, the deflector may be constructed by filling the mold 118, via electroplating, with a deflector material. Although various materials can be used, gold is considered a good selection because of its optical characteristics and its chemical inertness. The technology of gold-plating exists and is widely practiced. Traditionally, this is done using a metallic plating base, that can also serve as an adhesion layer and/or as a diffusion barrier and/or as an electrical conductor for the plating current. The same approach may be utilized in connection with the present fabrication method, in which case the plating base needs to be deposited before spinning the mold generating photo resist coating. With a conductive substrate, the option is provided of passing a plating current through the substrate, in which case there may be no need for an electrically conductive plating base.

The final fabrication step is shown in FIG. 4c. The photo resist coating 110 and mold 118 are dissolved to yield a free standing deflector body 122. The deflector 122 includes a forward reflecting surface 124, a rearward surface 126. The surfaces 124 and 126 extend from the lower substrate surface 106 to an upper deflector surface 128. Alternatively, if the photo resist material is selected to yield an optically transparent coating, as would be provided by PMMA, it may be left in place following the fabrication of the deflector body 122.

Advantageously, it will be observed that the resultant mirror/deflector structure is similar to the idealized structure shown in FIG. 3b. Thus, the reflecting surface 124 is positioned closely adjacent the laser mirror surface 100. Moreover, the reflecting surface 124 extends well beyond the upper substrate surface 104 such that symmetrical laser reflection is provided generally perpendicular to the substrate 102. Additionally, because the plating process minutely replicates the mold, mirror quality is determined by the characteristics of the developed resist surface, 116. In essence then, instead of etching a real surface into the wafer, a temporary surface is defined lithographically in photo resist. This is done ideally via X-ray exposure using hard X-rays due to their penetration depth and high degree of collimation. Other forms of light energy could also be used. It is submitted that such a photo lithographic definition of the reflecting plane can be done with greater perfection than with a subtractive etching process. In addition, the deflector may be cast from a material specifically selected for its reflective characteristics. Moreover, the reflecting surface 124 is the front surface of the fabricated deflector 122 and may be placed very close to the laser mirror facet 100. As indicated, the deflector can now rise above the surface of the wafer 102 and intercept the whole of the laser beam.

It will be understood and appreciated that the above-described fabrication method may be advantageously performed at the wafer scale to form a large scale laser integrated structure 130, as shown in FIG. 5. The structure 130 includes a multilayer wafer substrate 132 formed to provide an AlGaAs single-quantum well ridge laser 134. The wafer substrate 132 is formed from a plurality of semiconductor p and n layers grown epitaxially. Positioned between the p and n layers is an active quantum well layer 136 disposed within a ridge wave guide structure 138. Positive and negative conductive elements 140 and 142 are respectively positioned on the upper and lower surfaces of the substrate 132 to provide forward biasing. Upon activation, the quantum well layer 136 emits a laser beam 144 through the laser mirror 146 oriented perpendicularly with respect to the substrate 132. Beam deflection is provided by the deflector structure 148 extending from a substrate trench surface 150. A monitor diode structure 152 may be formed at the other end of the laser 134. It will be understood that the integrated structure 130 will preferably be fabricated to contain many laser devices 134. The integrated structure 130 may be scribed and cleaved as desired to form a variety of laser devices, including single point sources, linear array sources and two-dimensional laser arrays.

It will be understood that the deflecting structure described herein need not be limited to off-wafer optical beam output alone. Rather, the deflector could serve as an input device for receiving an off-wafer generated optical beam. In that case, the deflector may be positioned to deflect the off-wafer beam to an on-wafer optical receiving structure, such as a light sensitive diode sensor. In addition, the mirror/deflector structure described herein could be advantageously utilized for beam input and output as a wafer integrated optical input/output port.

Figure 6:
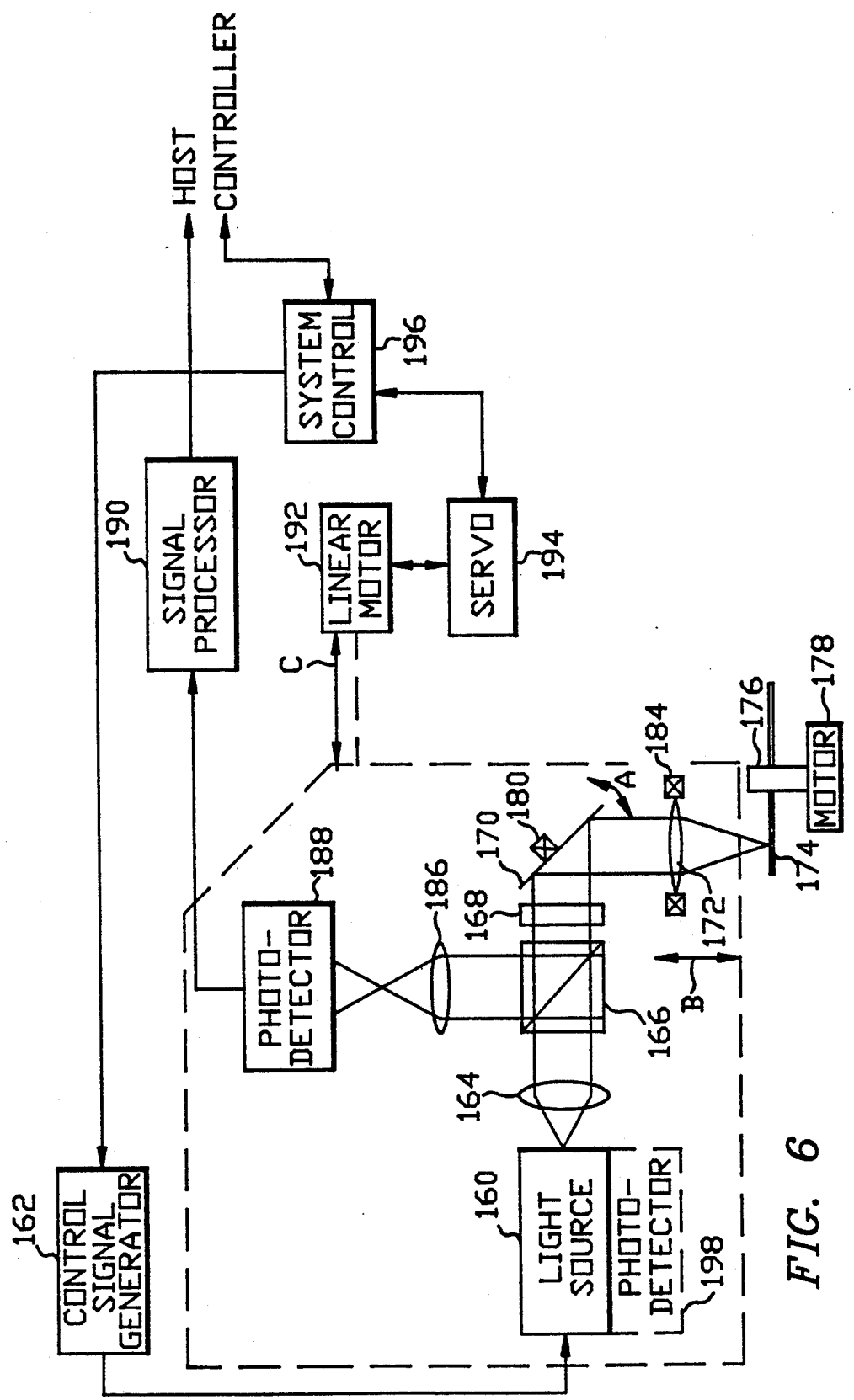
FIG. 6 is a block diagram of an optical storage system incorporating a laser mirror/deflector structure constructed in accordance with the present invention.

Such a structure could be used advantageously to provide a singular or integrated laser source and detector having wide applicability in optical storage, optical computing and optical scanning technologies. FIG. 6 illustrates an optical storage system operable in a read only mode or perhaps a write-once-read-many (WORM) mode. As shown, the system may include a light source 160 formed from a large scale integrated laser device constructed in accordance with the present invention and having one or more laser mirror/deflector structures. In the laser device a divergent laser beam is emitted from a laser mirror and reflected perpendicularly to the wafer substrate by a deflector positioned adjacent the laser mirror and at a divergent angle with respect thereto. The laser source 160 is energized by a control signal generator 162. The linearly polarized light beam from the laser source 160 is transmitted through a lens 164, a beam splitting prism 166, and a quarter wave plate 168 to a galvano-mirror 170. The light beam is circularly polarized by the quarter wave plate 168, reflected by the galvano-mirror 170 and focused by an objective lens 172 onto an optical disk 174. The optical disk 174 is supported by a spindle 176 connected to a motor 178 rotating the disk about a drive axis perpendicular to the plane of the disk. The galvano-mirror 170 is pivotally mounted and movable through an angle illustrated by the double arrow labeled A in FIG. 6. This movement of the galvano-mirror 170 is accomplished via solenoid 180 to move the light beam in a radial direction on the disk in order to follow an information track encoded thereon. The solenoid 180 is driven by a servocircuit (not illustrated) connected to a system control 196. The objective lens 172 is moved toward and away from the disk 174 as illustrated by the double arrow labeled B in FIG. 6. This movement of the objective lens along an axis perpendicular to a plane of the disk 174 is accomplished by means of a solenoid 184 energized by another servocircuit (not illustrated) and connected to the system control 196.

The optical disk 174 comprises a conventional underlined optical media and an overlined coverplate of either plastic or glass having a thickness of, for example, 0.6 mm. The objective lens 172 is moved toward and away from the disk 174 in order to focus a light beam to a spot on the optical media. Information is encoded on the media in binary form in concentric tracks or in a spiral track. In one conventional form of optical media, the data is encoded as a succession of pits and islands which correspond to ones and zeros.

Information contained on the disk is imparted to the reflected light beam by virtue of the fact that the reflected beam is phase shifted 180 degrees when incident on a pit but is not phase shifted when incident on an island. The resultant intensity modulated beam is transmitted back through the objective lens 172 to the galvano-mirror 170, and is reflected through the quarter wave plate 168. The quarter wave plate produces linear polarization at an angle of 90 degrees to the polarization vector of the source beam. The orthoganically polarized return beam is not passed through the beam splitting prism 166, but instead is reflected through an objective lens 186, to a photo detector 188. The photo detector provides an electrical signal modulated by the information containing return beam to a signal processor 190. The photo detector 188 may be a quad detector whose output also provides focus error information. Alternatively, the return beam may be directed to separate focus error and tracking error channels (not illustrated) as is well known in the art. Overall tracking across the optical disk 174 is provided by a linear motor 192 connected via a servo control device 194 to a system control unit 196 to drive the beam in the direction illustrated by the double arrow labeled C in FIG. 6. In an alternative construction, the photodetector 188 would not be used. Rather, an integral photodetector 198 could be combined with the light source 160 using an integrated laser device containing optical input/output ports as described above. In that case, the beam splitting mirror 166, the quarter wave plate 168, and the objective lens 186 would also be unnecessary.

Accordingly, several preferred embodiments of an integrated light deflector and fabrication method therefor have been shown and described. These embodiments are exemplary in nature and it should be understood that modification and adaptations thereof will occur to persons skilled in the art. For example, although a deflector of generally planar construction is shown, deflectors having curved surfaces could also be provided. Therefore, the protection afforded the invention should not be limited except in accordance with the spirit of the appended claims and their equivalents.

I claim:

1. An optical storage system, comprising:
    means for rotating an optical disk about a drive axis, said optical disk having information encoded on a surface thereof;
    a semi-conductor laser light source of emitting a light beam when energized, said light source being formed from a large scale laser integration device, said device including:
        an integral multilayered substrate having a first lower substrate surface, a second upper substrate surface parallel to said first substrate surface, and a wall integrally formed with and extending perpendicularly between said first substrate surface and said second substrate surface, said wall defining a laser mirror face through which the light beam of said laser light source is emitted above said first substrate surface and below said second substrate surface;
        at least one free standing die cast deflector integrally formed on and extending from said first substrate surface, said free standing deflector being spaced from said laser mirror face to receive the light beam of said laser light source;
        said deflector having a first deflector face, an upper surface and a rear surface;
        said deflector face providing means for directing the light beam emitted by said semi-conductor laser light source to the surface of said optical disk;
    detector means for receiving said light beam after it has been deflected by the optical disk for generating an output signal representative of the information encoded on the optical disk; and
    information recovery means for processing the output signal and generating data signals representative of the information encoded on the surface optical media.

2. The device set forth in claim 1 wherein said deflector is made from a material which is different from the material used to form said first substrate surface.

3. The device set forth in claim 1 wherein said second substrate surface is positioned generally parallel to and above said first substrate surface, but below said deflector upper surface.

4. The device set forth in claim 1 wherein said first deflector face extends at an angle and length sufficient to symmetrically deflect said laser beam generally perpendicularly from said substrate.

5. The device set forth in claim 1 further including an optical sensing element positioned on said substrate to receive light deflected from said deflector.

6. An optical storage system, comprising:
    means for rotating an optical disk about a drive axis, said optical disk having information encoded on a surface thereof;
    a semi-conductor laser light source for emitting a light beam when energized, said light source being formed from a large scale laser integration device, said device including:

an integral multilayered wafer substrate including an active semi-conductor laser device integrally formed therein, said substrate having a lower substrate surface and an upper substrate surface;

said substrate further including a laser mirror wall surface integrally formed with and extending perpendicularly between said lower and upper substrate surfaces, said laser mirror wall surface representing an exit point above said lower substrate surface and below said upper substrate surface for a diverging laser beam emitted by the laser device when the device is activated;

at least one free standing die cast deflector integrally formed on and extending from said lower substrate surface, said free standing die cast deflector being formed at an angle that diverges upwardly away from said laser mirror wall surface;

said deflector being spaced from said laser mirror wall surface and having a first deflector face, an upper surface and a rear surface, said deflector face being configured to receive said diverging laser beam exiting from said laser mirror wall surface and to deflect said laser beam generally perpendicularly from said substrate;

said first deflector face extending a distance upwardly from said lower substrate surface to symmetrically deflect said diverging laser beam;

said first deflector face providing means for directing the light beam emitted by said semiconductor laser light source to the surface of said optical disk;

detector means for receiving said beam after it has been deflected by the optical disk for generating an output signal representative of the information encoded on the optical disk; and information recovery means for processing the output signal and generating data signals representative of the information encoded on the surface of the optical media.

* * * * *

UNITED STATES PATENT AND TRADEMARK OFFICE
CERTIFICATE OF CORRECTION

PATENT NO. : 5,327,415
DATED : July 5, 1994
INVENTOR(S) : Vettiger et al.

It is certified that error appears in the above-indentified patent and that said Letters Patent is hereby corrected as shown below:

Column 8, line 17, please change "of" to --for--.

Signed and Sealed this

Thirtieth Day of August, 1994

Attest:

BRUCE LEHMAN

Attesting Officer

*Commissioner of Patents and Trademarks*